(12) United States Patent
Paramasivam et al.

(10) Patent No.: US 7,967,506 B2
(45) Date of Patent: Jun. 28, 2011

(54) POWER SUPPLY TEMPERATURE SENSOR AND SYSTEM

(75) Inventors: Saravanan Paramasivam, South Lyon, MI (US); Patrick Maguire, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 277 days.

(21) Appl. No.: 12/282,781

(22) PCT Filed: Dec. 18, 2006

(86) PCT No.: PCT/US2006/062234
§ 371 (c)(1),
(2), (4) Date: Sep. 12, 2008

(87) PCT Pub. No.: WO2007/108851
PCT Pub. Date: Sep. 27, 2007

(65) Prior Publication Data
US 2009/0041082 A1    Feb. 12, 2009

Related U.S. Application Data

(63) Continuation-in-part of application No. PCT/US2006/009891, filed on Mar. 16, 2006.

(60) Provisional application No. 60/662,418, filed on Mar. 16, 2005.

(51) Int. Cl.
*G01K 1/00* (2006.01)
(52) U.S. Cl. ........................ 374/208; 374/152
(58) Field of Classification Search .................. 374/152, 374/208
See application file for complete search history.

(56) References Cited

U.S. PATENT DOCUMENTS 3,356,980 A   12/1967   Roberts
3,718,881 A    2/1973   Szanny
(Continued)

FOREIGN PATENT DOCUMENTS

CN   1281268 A    1/2001
(Continued)

OTHER PUBLICATIONS

Chinese Office Action, dated Sep. 27, 2010, Chinese Application No. 200680053649.3, Applicant Ford Global Technologies, LLC, 8 pgs.

*Primary Examiner* — Lisa M Caputo
*Assistant Examiner* — Mirellys Jagan
(74) *Attorney, Agent, or Firm* — David B. Kelley; Brooks Kushman P.C.

(57) ABSTRACT

A power supply temperature sensor and system includes a power supply housing configured to receive at least one power supply unit, such as a battery cell. The power supply housing includes an aperture which provides communication between the battery cell and an ambient environment outside the power supply housing. A sensor having a sensing element is configured to sense a temperature of the battery cell, and a sensor housing surrounds at least a portion of the sensor, including at least a portion of the sensing element. This electrically isolates the sensing element from the battery cell. A portion of the sensor housing is configured to be disposed through the aperture in the power supply housing to make contact with the battery cell to facilitate conductive heat transfer between the battery cell and the sensor housing, thereby facilitating an accurate measurement of the temperature of the battery cell.

9 Claims, 3 Drawing Sheets

U.S. PATENT DOCUMENTS

| | | | |
|---|---|---|---|
| 3,976,854 | A | 8/1976 | Ishikawa et al. |
| 4,094,483 | A | 6/1978 | Busch |
| 4,522,898 | A | 6/1985 | Esrom |
| 4,554,221 | A | 11/1985 | Schmid |
| 4,572,878 | A | 2/1986 | Daugherty |
| 4,883,726 | A | 11/1989 | Peled et al. |
| 4,959,633 | A | 9/1990 | Kiraly et al. |
| 5,191,276 | A | 3/1993 | Zainaleain |
| 5,204,608 | A | 4/1993 | Koenck |
| 5,374,490 | A | 12/1994 | Aldecoa |
| 5,378,552 | A | 1/1995 | Dixon, Jr. |
| 5,391,972 | A | 2/1995 | Gardner et al. |
| 5,456,994 | A | 10/1995 | Mita |
| 5,558,950 | A | 9/1996 | Ovshinsky et al. |
| 5,654,870 | A | 8/1997 | Havener |
| 5,667,907 | A | 9/1997 | Audit et al. |
| 5,680,030 | A | 10/1997 | Kadouchi et al. |
| 5,689,173 | A | 11/1997 | Oosaki et al. |
| 5,736,272 | A | 4/1998 | Veenstra et al. |
| 5,818,198 | A | 10/1998 | Mito et al. |
| 5,830,599 | A | 11/1998 | Okamoto et al. |
| 5,879,831 | A | 3/1999 | Ovshinsky et al. |
| 5,963,423 | A | 10/1999 | Ikeda |
| 5,977,746 | A | 11/1999 | Hershberger et al. |
| 5,993,992 | A | 11/1999 | Field et al. |
| 6,023,146 | A | 2/2000 | Casale et al. |
| 6,097,173 | A | 8/2000 | Bryant, Jr. |
| 6,097,193 | A | 8/2000 | Bramwell |
| 6,111,387 | A | 8/2000 | Kouzu et al. |
| 6,174,618 | B1 | 1/2001 | Nishiyama et al. |
| 6,211,645 | B1 | 4/2001 | Kouzu et al. |
| 6,211,646 | B1 | 4/2001 | Kouzu et al. |
| 6,265,091 | B1 | 7/2001 | Pierson et al. |
| 6,270,920 | B1 | 8/2001 | Nakanishi et al. |
| 6,275,003 | B1 | 8/2001 | Marukawa et al. |
| 6,326,101 | B1 | 12/2001 | White et al. |
| 6,330,925 | B1 | 12/2001 | Ovshinsky et al. |
| 6,335,116 | B1 | 1/2002 | Yamane et al. |
| 6,340,877 | B1 | 1/2002 | Mita et al. |
| 6,372,377 | B1 | 4/2002 | Ovshinsky et al. |
| 6,399,238 | B1 | 6/2002 | Oweis et al. |
| 6,410,184 | B1 | 6/2002 | Horiuchi et al. |
| 6,422,027 | B1 | 7/2002 | Coates, Jr. et al. |
| 6,428,925 | B1 | 8/2002 | Takeno et al. |
| 6,439,932 | B1 | 8/2002 | Ripolone |
| 6,448,741 | B1 | 9/2002 | Inui et al. |
| 6,455,190 | B1 | 9/2002 | Inoue et al. |
| 6,465,986 | B1 | 10/2002 | Haba |
| 6,472,098 | B1 | 10/2002 | Sawada et al. |
| 6,479,185 | B1 | 11/2002 | Hilderbrand et al. |
| 6,479,187 | B1 | 11/2002 | Takasaki et al. |
| 6,489,747 | B2 | 12/2002 | Abe |
| 6,500,581 | B2 | 12/2002 | White et al. |
| 6,504,342 | B2 | 1/2003 | Inui et al. |
| 6,517,966 | B1 | 2/2003 | Marukawa et al. |
| 6,537,694 | B1 | 3/2003 | Sugiura et al. |
| 6,551,741 | B1 | 4/2003 | Hamada et al. |
| 6,557,655 | B2 | 5/2003 | Ovshinsky et al. |
| 6,566,005 | B1 | 5/2003 | Shimma et al. |
| 6,569,556 | B2 | 5/2003 | Zhou et al. |
| 6,569,561 | B1 | 5/2003 | Kimura et al. |
| 6,579,642 | B2 | 6/2003 | Yamane et al. |
| 6,599,660 | B2 | 7/2003 | Oda et al. |
| 6,606,245 | B2 | 8/2003 | Oda et al. |
| 6,610,439 | B1 | 8/2003 | Kimoto et al. |
| 6,627,345 | B1 | 9/2003 | Zemlok et al. |
| 6,632,560 | B1 | 10/2003 | Zhou et al. |
| 6,636,016 | B2 | 10/2003 | Tanaka et al. |
| 6,641,950 | B2 | 11/2003 | White et al. |
| 6,645,664 | B2 | 11/2003 | Nakanishi et al. |
| 6,692,864 | B1 | 2/2004 | Dansui et al. |
| 6,780,538 | B2 | 8/2004 | Hamada et al. |
| 6,783,886 | B1 | 8/2004 | Sakakibara et al. |
| 6,818,343 | B1 | 11/2004 | Kimoto et al. |
| 6,837,321 | B2 | 1/2005 | Ovshinsky et al. |
| 6,858,344 | B2 | 2/2005 | Marukawa et al. |
| 6,861,821 | B2 | 3/2005 | Masumoto et al. |
| 6,878,485 | B2 | 4/2005 | Ovshinsky et al. |
| 6,890,683 | B2 | 5/2005 | Asahina et al. |
| 6,913,852 | B2 | 7/2005 | Nakanishi et al. |
| 7,108,940 | B2 | 9/2006 | Sharrow et al. |
| 7,422,293 | B2 | 9/2008 | Chorian et al. |
| 7,465,088 | B2 * | 12/2008 | Garcia et al. ............ 374/153 |
| 7,766,544 | B2 * | 8/2010 | Shibuya et al. ........... 374/152 |
| 2001/0026886 | A1 | 10/2001 | Inui et al. |
| 2001/0046624 | A1 | 11/2001 | Goto et al. |
| 2002/0022159 | A1 | 2/2002 | Pierson et al. |
| 2002/0028375 | A1 | 3/2002 | Morishita et al. |
| 2002/0076580 | A1 | 6/2002 | Tudron |
| 2002/0182480 | A1 | 12/2002 | Hanauer et al. |
| 2002/0187390 | A1 | 12/2002 | Kimoto et al. |
| 2003/0017383 | A1 | 1/2003 | Ura et al. |
| 2003/0017387 | A1 | 1/2003 | Marukawa et al. |
| 2003/0027037 | A1 | 2/2003 | Moores, Jr. et al. |
| 2003/0054230 | A1 | 3/2003 | Al-Hallaj et al. |
| 2003/0082439 | A1 | 5/2003 | Sakakibara |
| 2003/0091896 | A1 | 5/2003 | Watanabe et al. |
| 2003/0096160 | A1 | 5/2003 | Sugiura et al. |
| 2003/0118898 | A1 | 6/2003 | Kimura et al. |
| 2003/0124419 | A1 | 7/2003 | Ito et al. |
| 2003/0134189 | A1 | 7/2003 | Kanai et al. |
| 2003/0141842 | A1 | 7/2003 | Izawa et al. |
| 2003/0143881 | A1 | 7/2003 | Ferranti et al. |
| 2003/0227275 | A1 | 12/2003 | Kishi et al. |
| 2004/0058233 | A1 | 3/2004 | Hamada et al. |
| 2004/0070367 | A1 | 4/2004 | Schadoffsky et al. |
| 2004/0081885 | A1 | 4/2004 | Ziegler et al. |
| 2004/0131927 | A1 | 7/2004 | Holland et al. |
| 2004/0137313 | A1 | 7/2004 | Jaura et al. |
| 2004/0137323 | A1 | 7/2004 | Sato |
| 2004/0165648 | A1 * | 8/2004 | Ikeda et al. ............ 374/208 |
| 2004/0197642 | A1 | 10/2004 | Sato |
| 2005/0053829 | A1 | 3/2005 | Han |
| 2005/0053831 | A1 | 3/2005 | Katzenberger et al. |
| 2005/0058892 | A1 | 3/2005 | Ovshinsky et al. |
| 2005/0074655 | A1 | 4/2005 | Ariyoshi et al. |
| 2005/0079408 | A1 | 4/2005 | Hirano |
| 2005/0095499 | A1 | 5/2005 | Kanai et al. |
| 2005/0100783 | A1 | 5/2005 | Ro et al. |
| 2005/0130033 | A1 | 6/2005 | Iwamura et al. |
| 2006/0028183 | A1 | 2/2006 | Izawa et al. |

FOREIGN PATENT DOCUMENTS

| | | |
|---|---|---|
| FR | 2827428 | 1/2003 |
| JP | 09106836 | 4/1997 |
| WO | 2006099602 A2 | 9/2006 |

* cited by examiner

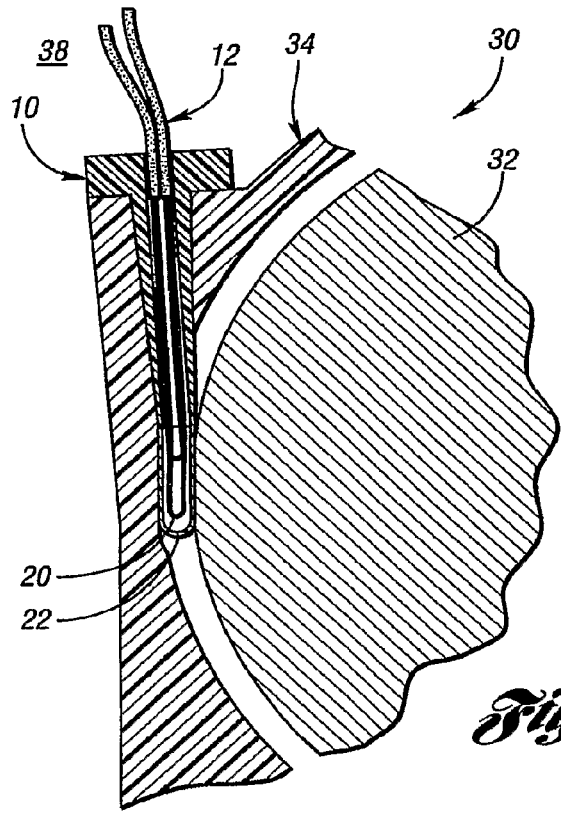
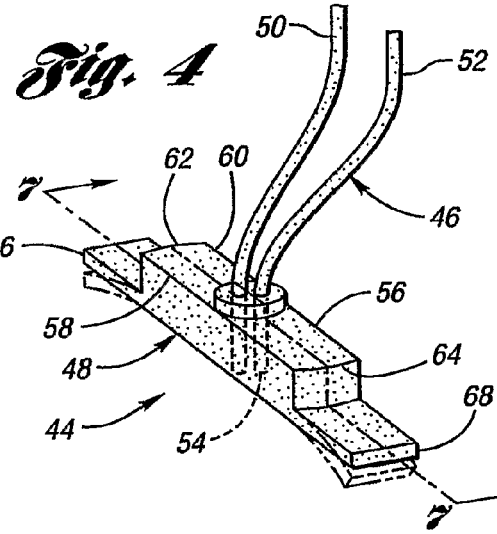
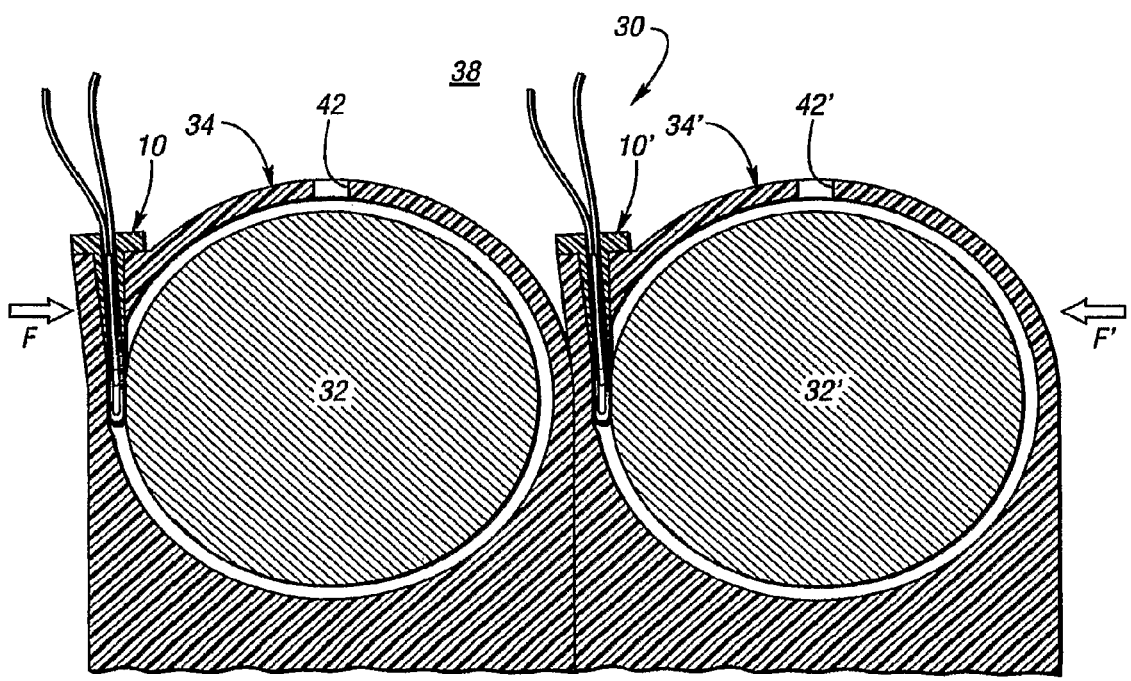

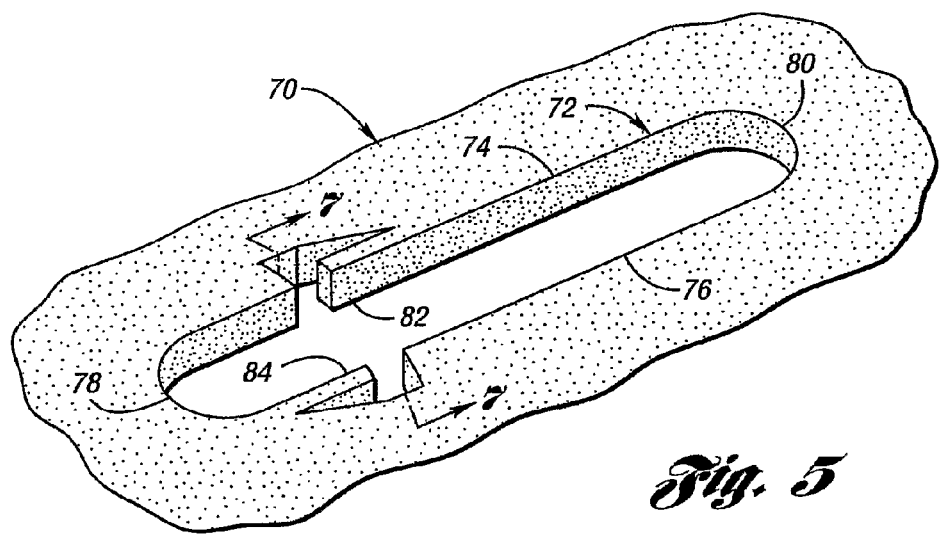
Fig. 5
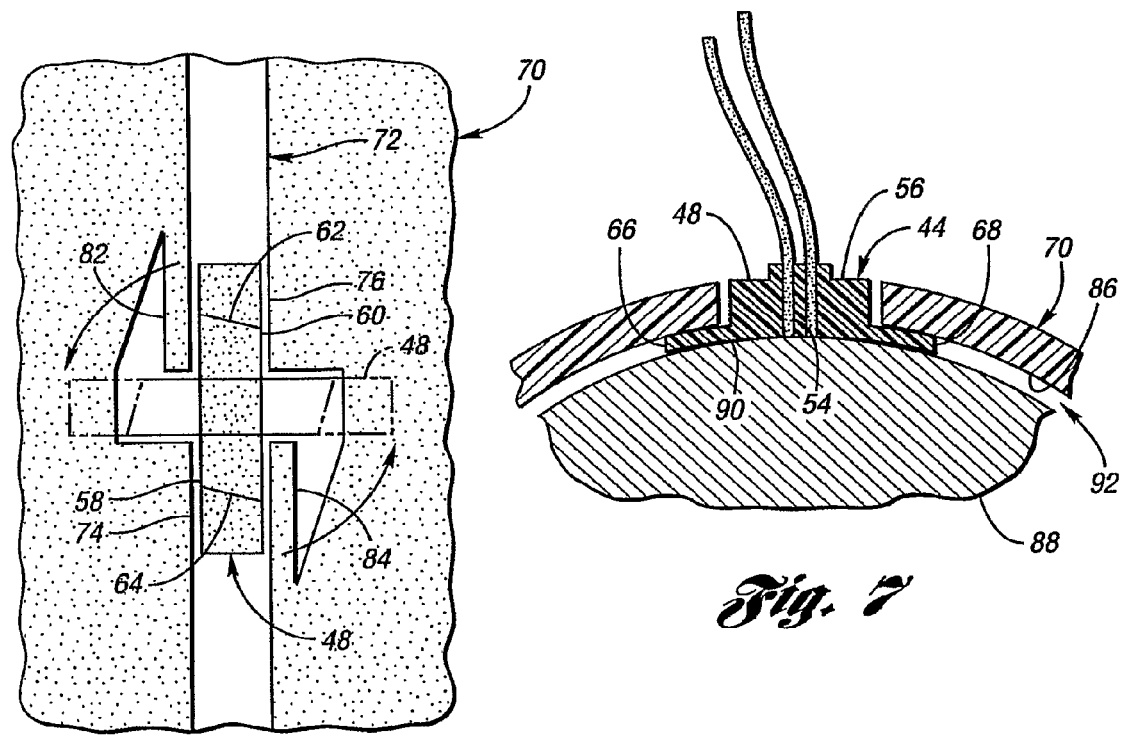
Fig. 6
Fig. 7

POWER SUPPLY TEMPERATURE SENSOR AND SYSTEM

CROSS-REFERENCE TO RELATED APPLICATIONS

This application is a continuation-in-part of International Application No. PCT/US2006/009891 filed 16 Mar. 2006, which claims the benefit of U.S. Provisional Application Ser. No. 60/662,418, filed 16 Mar. 2005, each of which is hereby incorporated herein by reference.

BACKGROUND OF THE INVENTION

1. Field of the Invention

The present invention relates to a power supply temperature sensor and system.

2. Background Art

High voltage batteries, for example, of the type used in hybrid electric vehicles (HEV's), require control and maintenance based on battery temperature. In the case of a high voltage battery system made up of many individual battery cells, the respective temperatures of the cells may vary widely throughout different parts of the battery system. Therefore, it is often desirable to measure the temperature of many different cells to provide a clear picture of the thermal state of the battery system. In order to increase the accuracy of the temperature measurements, it is desirable to measure the temperature as close to the battery cell core as possible, without impairing either the performance or life of the cell.

In order to properly cool a large battery pack made up of many cells, a fan may be used to circulate air across the battery cells to provide convective cooling. The fan may be part of a refrigeration system that provides very cool air to the battery cells to keep them from overheating. In such a case, it is undesirable to have an air conditioning fan blow directly on a battery cell temperature sensor, as this may give an inaccurate temperature reading.

Temperature sensors that are placed close to a battery cell, but not in contact with it, may also give an inaccurate reading of the battery cell temperature. To adjust for this, some systems employ the use of a compensation factor to account for the air space between the temperature sensor and the battery cell. The use of compensation factors, however, cannot always compensate adequately for the measurement inaccuracy. Placing the temperature sensor in direct contact with the battery cell, however, may not be practical in some applications. This is because the high voltage output from the battery cells may damage the low voltage sensor if electrical contact is made between them. In addition, such contact may result in the sensor carrying the high voltage potential to new locations that must also then be protected from the high voltage potential.

Therefore, a need exists for a power supply temperature sensor and system that provides accurate temperature measurements of individual power supply units, such as battery cells, without exposing the temperature sensors to potentially damaging high voltage. Moreover, a need exists to provide temperature sensors that are not unduly influenced by convective cooling currents in the power supply system.

SUMMARY OF THE INVENTION

Addressing the shortcomings of prior art sensors and systems, embodiments of the present invention provide a power supply system that includes a temperature sensor arrangement electrically isolated from the battery cell whose temperature it is measuring. The temperature sensor arrangement includes a temperature sensor, such as a thermistor that is at least partially covered by a sensor housing, such as an injection molded plastic.

In some embodiments of the present invention, the sensor housing includes a "handle" feature for a tool or a hand to hold and manipulate the orientation of the housing. The housing may also include a pair of tabs that are configured to cooperate with a housing of the power supply system. The power supply housing is configured to receive a plurality of power supply units, for example, battery cells. In order to facilitate convective cooling across the battery cells, the power supply housing can include a number of apertures configured to allow air to flow between an inside of the power supply housing adjacent the battery cells and an ambient environment outside of the power supply housing.

In some embodiments, the sensor housing is configured to be inserted into an air slot in the power supply housing. The sensor housing can then be rotated to lock it into place. The sensor housing may then be retained by two flexible locking members molded into the power supply housing. The plastic tabs on the sensor housing act as biasing members against an inside wall of the power supply housing to bias the sensor housing toward the battery cell such that contact is maintained between the sensor housing and the battery cell.

Embodiments of the present invention also include a temperature sensor arrangement having a temperature sensor, such as the thermistor described above, and a sensor housing that includes one or more locking members configured to cooperate with the power supply housing to inhibit movement of the temperature sensor once it has been installed adjacent the battery cell. The sensor housing also provides electrical insulation between the battery cell and the thermistor, while reducing the inaccuracies associated with exposure to convective cooling air currents inside the power supply housing.

Embodiments of the present invention also include a temperature sensor arrangement for an electrical power supply system having a power supply housing configured to receive at least one power supply unit therein. The power supply housing includes an aperture therethrough providing communication between a respective power supply unit and an ambient environment outside the housing. The sensor arrangement includes a sensor having a sensing element and configured to sense a temperature of a respective power supply unit. A sensor housing surrounds at least a portion of the sensor. The sensor housing includes a first portion surrounding at least a portion of the sensing element to electrically insulate the sensing element from the respective power supply unit. The first portion of the sensor housing is configured to be disposed through the aperture in the power supply housing to contact the respective power supply unit to facilitate conductive heat transfer between the respective power supply unit and the first portion of the sensor housing. The sensor housing includes a retaining feature configured to cooperate with a portion of the power supply housing to inhibit movement of the sensor housing, thereby maintaining contact between the first portion of the sensor housing and the respective power supply unit.

Embodiments of the invention also provide an electrical power supply system including a power supply housing, a sensor, and a sensor housing, generally as described above. The power supply housing may include a pair of flexible locking members adjacent the aperture, which can form a generally elongate opening having two long sides and two short sides. The flexible locking members can be formed as part of the power supply housing such that each is disposed along a respective long side of the aperture. The sensor housing can include a raised portion having a generally quadrilateral cross section with two long sides and two short sides. The raised portion is configured to be at least partially inserted into the elongate opening in the power supply housing; upon insertion, the sensor housing is in a first position. The sensor housing can then be rotated in the elongate opening of the power supply housing to a second position where the long sides of the raised portion are generally perpendicular to the long sides of the elongate opening. In this second position, the raised portion engages the flexible locking members of the power supply housing to inhibit movement of the sensor housing.

BRIEF DESCRIPTION OF THE DRAWINGS

FIG. 2A shows a cross-sectional view of the temperature sensor arrangement of FIG. 1, installed in a power supply housing as part of the power supply system shown in FIG. 2;

FIG. 3 shows a cross-sectional view of the power supply system shown in FIG. 2, including a second battery cell and temperature sensor arrangement;

FIG. 4 shows a temperature sensor arrangement in accordance with another embodiment of the present invention;

FIG. 5 shows a portion of a power supply housing configured to mate with the temperature sensor arrangement shown in FIG. 4;

FIG. 6 shows the temperature sensor arrangement of FIG. 4 being rotated into a locking position in the power supply housing shown in FIG. 5; and FIG. 7 shows a cross-sectional view of the temperature sensor arrangement of FIG. 4 inserted into the power supply housing shown in FIG. 5.

DETAILED DESCRIPTION OF EMBODIMENTS OF THE INVENTION

Figure 1:
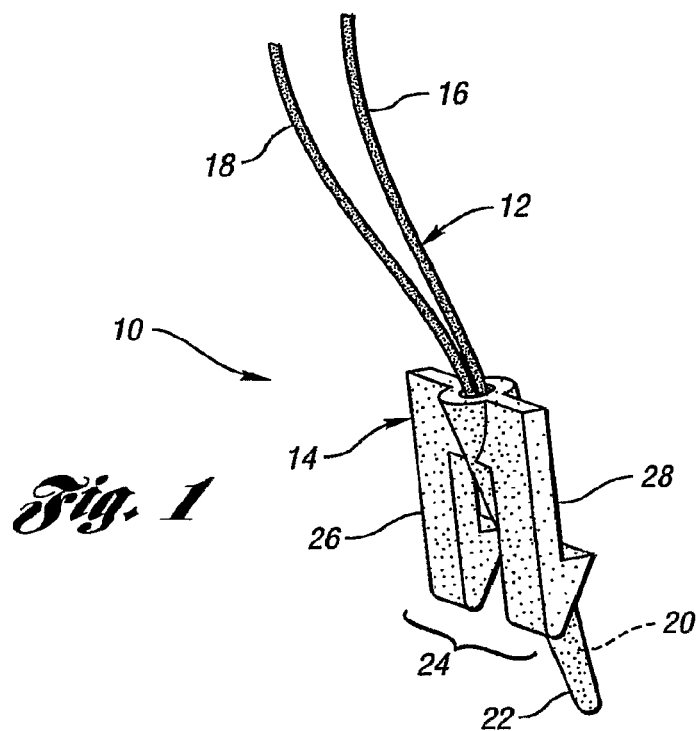
FIG. 1 shows a perspective view of a temperature sensor arrangement in accordance with an embodiment of the present invention.

FIG. 1 shows a temperature sensor arrangement 10 in accordance with one embodiment of the present invention. The temperature sensor arrangement 10 includes a temperature sensor 12 and a sensor housing 14, surrounding a portion of the temperature sensor 12. In the embodiment shown in FIG. 1, the temperature sensor 12 is a thermistor of conventional design including wires 16, 18 that form a sensing element 20 (hidden in FIG. 1) surrounded by a first portion 22 of the sensor housing 14. The sensor housing 14 includes a retaining feature 24 configured in the embodiment shown in FIG. 1 as a pair of flexible arms 26, 28. As described below in conjunction with FIG. 2, the flexible arms 26, 28 are configured to inhibit movement of the sensor housing 14 when it is attached to a power supply housing.

Figure 2:
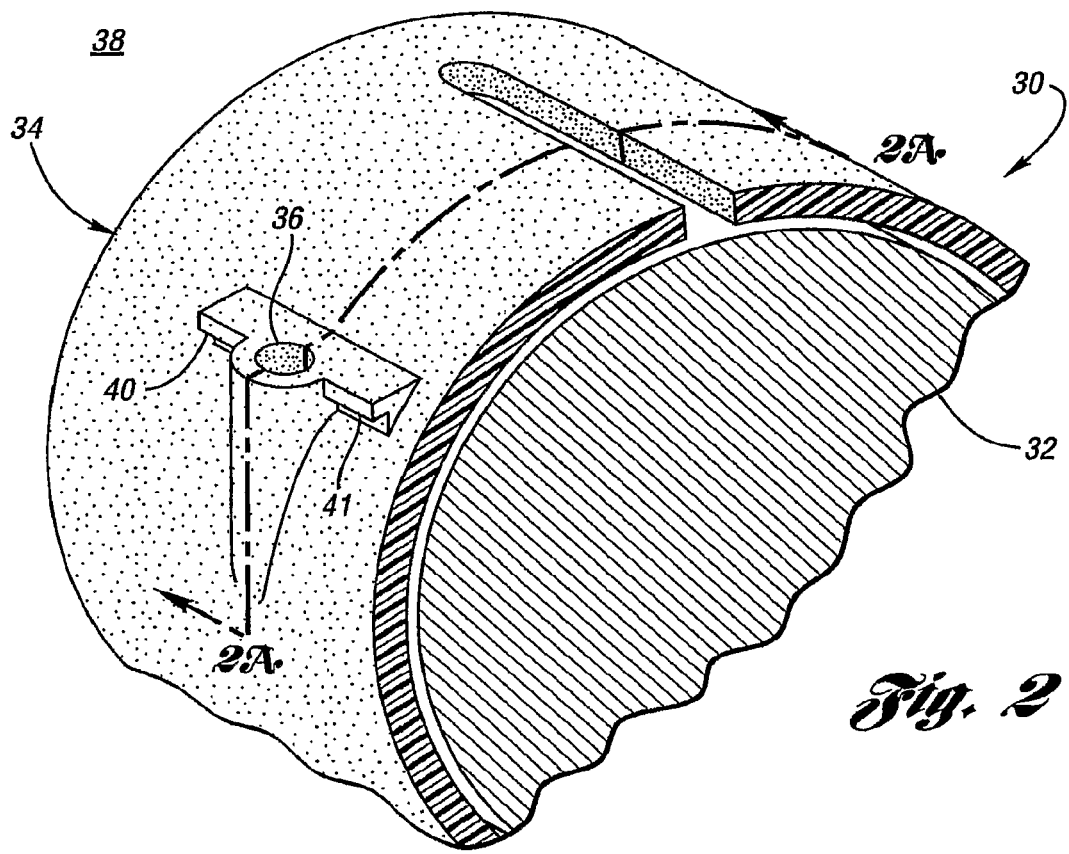
FIG. 2 shows a cross-sectional view of a portion of a power supply system in accordance with an embodiment of the present invention.

FIG. 2 shows a portion of an electrical power supply system 30 in accordance with an embodiment of the present invention. Included as part of the power supply system 30 is a power supply unit, or battery cell 32, disposed within a power supply housing 34. The power supply housing 34 includes an aperture 36 formed therein. The aperture 36 provides communication between the battery cell 32 and an ambient environment 38 outside the power supply housing 34. As shown in FIG. 2, the aperture 36 is generally cylindrical, which allows the first portion 22 of the sensor housing 14—see FIG. 2A—to be inserted therein. The flexible arms 26, 28 of the sensor housing 14—see FIG. 1—are configured to respectively engage tabs 40, 41 attached to the power supply housing 34. In the embodiment shown in FIG. 2, the tabs 40, 41 are integrally molded with the power supply housing 34.

FIG. 2A is a sectional view of the power supply system 30 of FIG. 2 taken through lines 2A-2A, showing the temperature sensor arrangement 10 of FIG. 1 installed in the power supply housing 34. As shown in FIG. 2A, the first portion 22 of the sensor housing 14 is in direct contact with the battery cell 32 to help facilitate conductive heat transfer between the battery cell 32 and the first portion 22 of the sensor housing 14. This helps to ensure an accurate temperature measurement by the sensing element 20 of the thermistor 12. Although only a portion of the battery cell 32 is shown in FIG. 2, it is contemplated that the power supply system 30 may have a plurality of battery cells. For example, a number of power supply housings, such as the power supply housing 34, may be disposed adjacent to each other.

FIG. 3 shows one such arrangement for the power supply system 30. In particular, the power supply housing 34 containing temperature sensor arrangement 10 and the battery cell 32 is shown as directly adjacent to a second power supply housing 34' that includes a temperature sensor arrangement 10' and a battery cell 32'. In practice, it is contemplated that adjacent arrangements of battery cells and power supply housings will be held together, for example, with side plates and connecting rods, such as illustrated and described in International Patent Application No. PCT/US2006/009891 referenced above.

The use of side plates and connecting rods will provide a clamping force—shown in FIG. 3 as forces F, F'—that further helps to ensure good contact between the sensor arrangements 10, 10' and their respective battery cells 32, 32'. The sensor arrangements 10, 10' can be inserted into the respective power supply housings 34, 34' before the clamping force is applied to help ensure that they are firmly positioned. Subsequent application of the clamping force can result in an interference fit for improved thermal conduction and retention.

Also shown in FIG. 3 are apertures 42, 42', which may be configured as elongate openings to allow air flow around the battery cells 32, 32' to exit through or enter from the ambient environment 38 outside the power supply housings 34, 34'. As described in detail below, apertures such as 42, 42' can provide a location for a sensor arrangement in accordance with another embodiment of the present invention. FIG. 4 shows one such sensor arrangement 44, which also includes a sensor 46 and a sensor housing 48. The sensor 46, like the sensor 12 shown in FIG. 1, is a thermistor that includes wires 50, 52 and a sensing element 54. The sensing element 54 is surrounded by a first portion, or raised portion 56, of the sensor housing 48. From the perspective view of the sensor arrangement 44 shown in FIG. 4, it is readily seen that a top view of the raised portion 56 of the sensor housing 48 has a generally quadrilateral cross section, including two long sides 58, 60 and two short sides 62, 64. The quadrilateral cross section may be generally rectangular, or, as shown in FIG. 4 and further illustrated in FIG. 6, it may be generally configured as a parallelogram, with the two short sides 62, 64 forming an oblique angle with the two long sides 56, 58.

As shown in FIG. 4, the sensor housing 48 also includes a pair of biasing members 66, 68 disposed adjacent the short sides 62, 64 of the raised portion 56. Shown in phantom in FIG. 4 are the biasing members 66, 68 curved downward, illustrating their flexibility and the deformation they undergo upon installation into a power supply housing. The sensor housing 48 is configured to fit into an aperture, and in particular an aperture configured as an elongate opening in a power supply housing such as shown in FIG. 5. FIG. 5 shows a portion of a power supply housing 70 having an aperture, or elongate opening 72 therein. The elongate opening 72 includes two long sides 74, 76, and two short sides 78, 80. Adjacent the two long sides 74, 76 are flexible locking members 82, 84, which, in the embodiment shown in FIG. 5, are cantilevered members integrally molded with the power supply housing 70.

FIG. 6 illustrates the locking of the sensor housing 48 into the power supply housing 70. Shown in solid lines is the power supply housing 70 in a first position in which the long sides 58, 60 of the raised portion 56 are generally parallel to the long sides 74, 76 of the elongate opening 72. Rotating the sensor housing 48 one-quarter turn counterclockwise puts the sensor housing 48 in a second position—shown in phantom—such that the long sides 58, 60 of the raised portion 56 are generally perpendicular to the long sides 74, 76 of the elongate opening 72. In this position, the raised portion 56 engages the flexible locking members 82, 84 of the power supply housing 70. Also shown in FIG. 6, the angled short sides 62, 64 of the raised portion 56 facilitate movement of the sensor housing 48 between the first and second positions.

The illustrations in FIGS. 4 and 5 each contain cut lines 7-7. The assembly of the sensor arrangement 44 with the power supply housing 70 is shown in a cross-sectional view in FIG. 7. In FIG. 7, it is illustrated how biasing members 66, 68 cooperate with an inner wall 86 of the power supply housing 70 to bias the sensor housing 48 toward a battery cell 88 disposed within the power supply housing 70. In particular, the biasing member 66, 68 bias the raised portion 56 of the sensor housing 48 downward such that contact is made between a lower surface 90 of the sensor housing 48 and the battery cell 88.

As shown in FIG. 7, the sensing element 54 of the sensor arrangement 44 is disposed very near the bottom surface 90 of the sensor housing 48. Therefore, as heat is conducted into the bottom surface 90, facilitated by its contact with the battery cell 88, the heat is readily transferred to the sensing element 54 of the thermistor 46 to provide an accurate reading of the temperature of the battery cell 88. Moreover, the sensor housing 48 electrically insulates the sensing element 54 from the battery cell 88, and further provides some thermal isolation from the convective cooling currents that may flow in a gap 92 between the inner wall 86 of the power supply housing 70 and the battery cell 88. Thus, the arrangement shown in FIG. 7 provides accurate battery cell temperatures that can be used as part of an effective battery thermal management system.

While the best mode for carrying out the invention has been described in detail, those familiar with the art to which this invention relates will recognize various alternative designs and embodiments for practicing the invention as defined by the following claims.

What is claimed:

1. A temperature sensor arrangement for an electrical power supply system having a power supply housing configured to receive at least one power supply unit therein and including an aperture therethrough forming a generally elongate opening having two long sides and two short sides, and providing communication between a respective power supply unit and an ambient environment outside the housing, the power supply housing further including a pair of flexible locking members adjacent the aperture and disposed along a length of a respective long side, the sensor arrangement comprising:

a sensor having a sensing element and configured to sense a temperature of a respective power supply unit; and a sensor housing surrounding at least a portion of the sensor, the sensor housing including a first portion surrounding at least a portion of the sensing element to electrically insulate the sensing element from the respective power supply unit, the first portion of the sensor housing being configured to be disposed through the aperture in the power supply housing to contact the respective power supply unit to facilitate conductive heat transfer between the respective power supply unit and the first portion of the sensor housing, the sensor housing including a retaining feature having a raised portion configured to cooperate with the flexible locking members to inhibit movement of the sensor housing, thereby maintaining contact between the first portion of the sensor housing and the respective power supply unit, the raised portion of the sensor housing including a generally quadrilateral cross section having two long sides and two short sides, the raised portion being further configured to be at least partially inserted into the elongate opening in a first position wherein the long sides of the raised portion are parallel to the long sides of the elongate opening, the sensor housing being rotatable in the elongate opening to a second position wherein the long sides of the raised portion are generally perpendicular to the long sides of the elongate opening and the raised portion engages the flexible locking members.

2. The sensor arrangement of claim 1, wherein the generally quadrilateral cross section of the raised portion generally forms a parallelogram, the short sides of the cross section meeting the long sides of the cross section at an oblique angle, thereby facilitating rotation of the sensor housing from the first position to the second position.

3. The sensor arrangement of claim 1, wherein the sensor housing includes a biasing member adjacent the raised portion and configured to cooperate with an inner wall of the power supply housing to bias the sensor housing toward the respective power supply unit to facilitate contact between the first portion of the sensor housing and the respective power supply unit.

4. The sensor arrangement of claim 3, wherein the sensor housing includes two of the biasing members disposed along opposing short sides of the raised portion, each of the biasing members being configured to cooperate with the inner wall of the power supply housing to bias the sensor housing toward the respective power supply unit.

5. An electrical power supply system, comprising:

a power supply housing configured to receive at least one power supply unit therein and including:

an aperture therethrough forming a generally elongate opening having two long sides and two short sides, and providing communication between a respective power supply unit and an ambient environment outside the housing, and a pair of flexible locking members adjacent the aperture and disposed along a length of a respective long side;

a sensor having a sensing element and configured to sense a temperature of a respective power supply unit; and a sensor housing surrounding at least a portion of the sensor, the sensor housing including a first portion surrounding at least a portion of the sensing element to electrically insulate the sensing element from the respective power supply unit, the first portion of the sensor housing being configured to be disposed through the aperture in the power supply housing to contact the respective power supply unit to facilitate conductive heat transfer between the respective power supply unit and the first portion of the sensor housing, the sensor housing including a retaining feature having a raised portion including a generally quadrilateral cross section having two long sides and two short sides, and configured to cooperate with the flexible locking members to inhibit movement of the sensor housing, thereby maintaining contact between the first portion of the sensor housing and the respective power supply unit, the raised portion being further configured to be at least partially inserted into the elongate opening in a first position wherein the long sides of the raised portion are parallel to the long sides of the elongate opening, the sensor housing being rotatable in the elongate opening to a second position wherein the long sides of the raised portion are generally perpendicular to the long sides of the elongate opening, and the raised portion engages the flexible locking members.

6. The power supply system of claim 5, wherein each of the flexible locking members include a cantilevered member integrally molded with the power supply housing.

7. The power supply system of claim 5, wherein the generally quadrilateral cross section of the raised portion generally forms a parallelogram, the short sides of the cross section meeting the long sides of the cross section at an oblique angle, thereby facilitating rotation of the sensor housing from the first position to the second position.

8. The power supply system of claim 5, wherein the sensor housing includes a biasing member adjacent the raised portion and configured to cooperate with an inner wall of the power supply housing to bias the sensor housing toward the respective power supply unit to facilitate contact between the first portion of the sensor housing and the respective power supply unit.

9. The power supply system of claim 8, wherein the sensor housing includes two of the biasing members disposed along opposing short sides of the raised portion, each of the biasing members being configured to cooperate with the inner wall of the power supply housing to bias the sensor housing toward the respective power supply unit.

* * * * *